United States Patent [19]

Augustine et al.

[11] Patent Number: 5,895,583
[45] Date of Patent: Apr. 20, 1999

[54] METHOD OF PREPARING SILICON CARBIDE WAFERS FOR EPITAXIAL GROWTH

[75] Inventors: Godfrey Augustine, Monroeville; Donovan L. Barrett, Pittsburgh; Elizabeth Ann Halgas, Monroeville, all of Pa.

[73] Assignee: Northrop Grumman Corporation, Los Angeles, Calif.

[21] Appl. No.: 08/752,112

[22] Filed: Nov. 20, 1996

[51] Int. Cl.[6] ............................................. C23F 1/00
[52] U.S. Cl. .................. 216/53; 216/88; 216/89; 216/90; 216/91; 216/99; 216/57; 117/97; 117/951
[58] Field of Search ..................... 216/53, 88, 89, 216/99, 57, 90, 91; 117/97, 951

[56] References Cited

U.S. PATENT DOCUMENTS

| | | | |
|---|---|---|---|
| 3,956,092 | 5/1976 | Kampe et al. | 204/192.16 |
| 4,475,981 | 10/1984 | Rea | 216/89 |
| 4,599,827 | 7/1986 | Goodwin | 451/57 |
| 4,837,923 | 6/1989 | Brar et al. | 51/318 |
| 5,165,981 | 11/1992 | Yamakawa et al. | 428/141 |
| 5,300,130 | 4/1994 | Rostoker | 51/309 |
| 5,483,084 | 1/1996 | Hirabayashi | 427/314 |
| 5,718,618 | 2/1998 | Guckel et al. | 451/41 |

*Primary Examiner*—Maria Nuzzolillo
*Assistant Examiner*—Laura Weiner
*Attorney, Agent, or Firm*—Walter G. Sutcliff

[57] ABSTRACT

Silicon carbide wafers are prepared for semiconductor epitaxial growth by first lapping a silicon carbide wafer derived from a boule, by placing the wafer in a recess of a metal backed template and moving the wafer over and against a rotating plate. Two different diamond slurry mixtures of progressively smaller diamond grit sizes are sequentially used, along with a lubricant, for a predetermined period of time. The lapping operation is followed by a polishing operation which sequentially utilizes two different diamond slurry mixtures of progressively smaller diamond grit sizes, along with three different apertured pads sequentially applied to a rotatable plate, with the pads being of progressively softer composition. In a preferred embodiment the wafers are cleaned and the templates are changed after each new diamond slurry mixture used.

8 Claims, 5 Drawing Sheets

METHOD OF PREPARING SILICON CARBIDE WAFERS FOR EPITAXIAL GROWTH

BACKGROUND OF THE INVENTION

1. Field of the Invention

The invention in general relates to silicon carbide technology and more particularly to the preparation of a silicon carbide wafer for production of a silicon carbide semiconductor device.

2. Description of Related Art

Silicon carbide is being used extensively as a semiconductor material for various electronic applications. Semiconductor devices of silicon carbide have the ability to operate at higher voltages and temperatures than conventional silicon or gallium arsenide devices thus providing for higher power devices with reduced cooling requirements. Silicon carbide metal-semiconductor field effect transistors (MESFET) have been made to operate at power densities two times the highest reported for a GaAs MESFET and silicon carbide static induction transistors have operated at four times the power density of comparable silicon devices for high frequency microwave radar systems.

Electronic applications for silicon carbide semiconductor devices include compact, low cost airborne, ship and ground radars, aircraft engine and flight controls, electric tank and ship propulsion systems and satellite communications, to name a few. In the commercial sector, silicon carbide may be used in the field of high definition television, industrial power conditioning, nuclear control and instrumentation and electric vehicle power trains.

Silicon carbide semiconductor devices are fabricated utilizing a thin silicon carbide wafer which is obtained from the sawing of a silicon carbide crystal boule. The sawing operation results in a wafer surface which, although appearing smooth, actually is damaged and contains microscopic scratches completely unacceptable for a subsequent epitaxial growth procedure. Due to the damaged surface the resulting semiconductor device would either not operate or operate at reduced efficiency.

Accordingly, the silicon carbide wafer surface must be highly polished to substantially eliminate all traces of any scratches and surface defects. In view of the fact that silicon carbide is twice as hard as silicon, the exact process for polishing silicon wafers is unsuitable for silicon carbide. Conventional optical polishing techniques may take ten days or more to achieve an acceptable surface finish for silicon carbide wafers.

The present invention reduces silicon carbide wafer polishing time to a matter of hours.

SUMMARY OF THE INVENTION

In accordance with the present invention a silicon carbide wafer is placed within a recess of a wafer holding template, with the surface of the wafer extending beyond the surface of the template. A plurality of wafers can be accommodated in a template having multiple recesses. The surface of the wafer is placed against the surface of a rotating plate and the template is moved relative to the rotating plate. The wafer surface is lapped by successively applying at least two diamond slurry mixtures and a lubricant to the surface of the rotating plate, with the diamond slurry mixtures having progressively smaller diamond grit sizes.

After lapping, final polishing is accomplished utilizing a plurality of successively softer pads applied to the surface of a rotating plate, which may be lighter in weight than the rotating plate used in lapping. During this polishing phase at least two diamond slurry mixtures and lubricant are successively applied to the pad surface currently in use, with the diamond slurry mixtures having progressively smaller diamond grit sizes. If desired, the polished wafer surface may thereafter be subjected to a plasma etching such as by reactive ion etching.

DESCRIPTION OF THE PREFERRED EMBODIMENT

Figure 1:
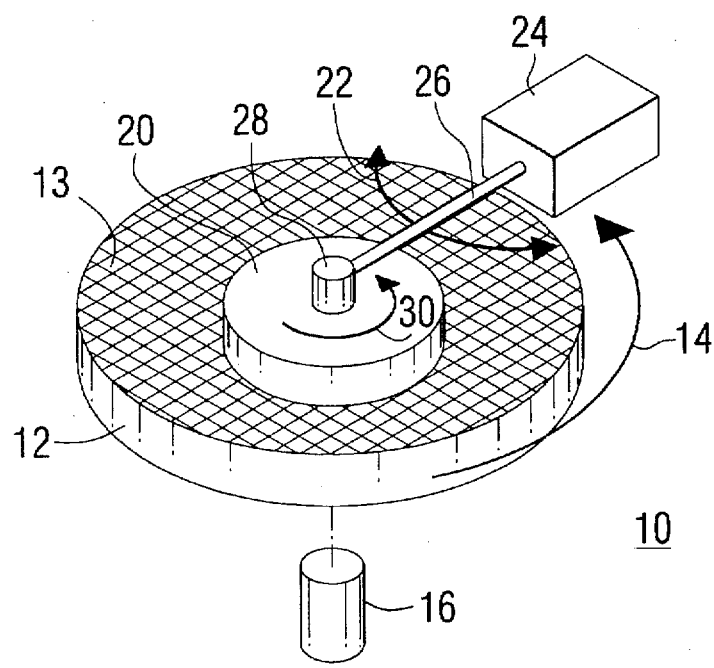
FIG. 1 illustrates basic elements of polishing apparatus used for polishing semiconductor wafers.

FIG. 1 illustrates some basic components of a commercially available wafer polishing machine. The apparatus 10 includes a rotating plate 12 having a waffled surface 13 and driven in rotation, as indicated by arrow 14, by means of motor drive 16. A smaller upper plate 20 is driven in oscillation, as indicated by arrow 22, by means of drive mechanism 24 and arm 26 which also applies a desired vertical force to the oscillating plate 20. By virtue of a pivotal connection 28, the oscillating plate 20 also has imparted thereto a rotational motion, as indicated by arrow 30.

Figure 2:
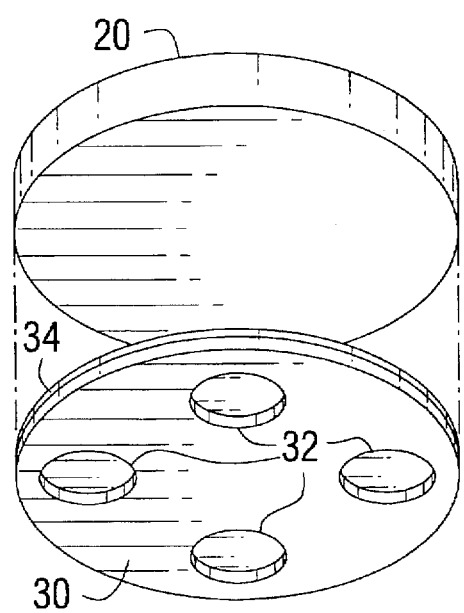
FIG. 2 is an exploded view of a wafer holding template and backing plate utilized herein.

A wafer to be polished is placed between the rotating plate 12 and the oscillating plate 20. FIG. 2 illustrates a template which may be used in the process. The template 30 includes one or more recesses 32 for receiving respective wafers, and a felt backing 34 having an adhesive coating for adhesive attachment to the underside of oscillating plate 20. The felt backing is moistened with a liquid such as glycerin to hold the wafers in place during surface treatment operations.

The use of such template eliminates the cleaning problems normally associated with a waxdown procedure wherein the wafers would be held in place by a wax applied to the undersurface of the oscillating plate. Further, the use of wax with silicon carbide wafers presents an additional problem in that wax can penetrate into micropores that may be present in the silicon carbide wafer due to the crystal growth process. The entrapped wax may hold unwanted grit used in the surface preparation steps, even after cleaning, and cause scratching in subsequent steps.

Figure 3:
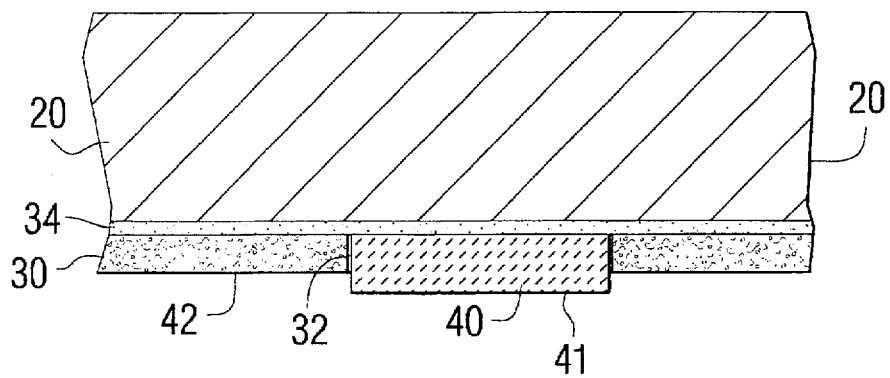
FIG. 3 is a cross-sectional view of a wafer positioned within the template of FIG. 2.

As illustrated in FIG. 3, at least one silicon carbide wafer 40 is positioned within a template recess 32 in a manner that the surface 41 of wafer 40 extends beyond the surface 42 of the template 30.

Figure 4:
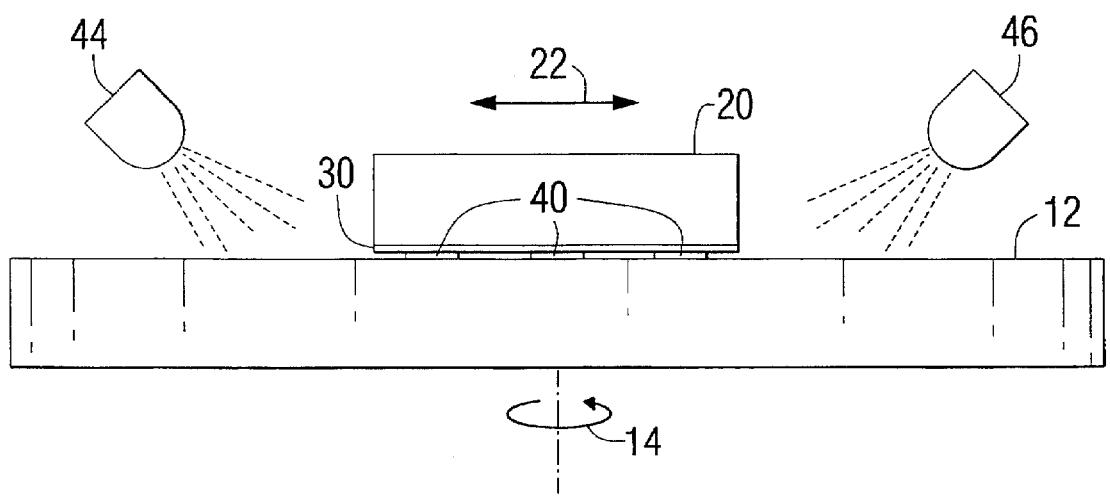
FIG. 4 is a view of a lapping procedure utilized herein.

In accordance with one embodiment of the present invention, and as illustrated in FIG. 4, the wafers 40 are placed against the rotating plate 12 for an initial lapping operation in the surface preparation procedure. During relative movement of the rotating plate 12 and oscillating plate 20 an abrasive diamond slurry mixture from source 44 is applied to the surface of the rotating plate 12, preferably by a spraying operation. The diamond particles have a certain grit size, for example 15 microns (A size) and is the largest grit size used in the process. In addition to the diamond slurry mixture, a lubricant, from source 46 is also sprayed on the surface of the rotating plate 12 to reduce the concentration of the diamond slurry mixture. The diamond slurry mixtures utilized herein as well as the lubricant, sold under the brand name Diasol, are available from Fujimi Corporation of Elmhurst Ill.

As will be later described, the diamond slurry mixture and lubricant are sprayed at respective timed intervals for an initial period of time after which the wafers are removed and thoroughly cleaned in an ultrasonic cleaner with deionized water. The above process is then repeated with at least one more diamond slurry mixture having a smaller diamond grit size such as 12 microns (B size). For each change of grit size a new template 30 should be used and if the same plates are utilized for the successively smaller grit sizes, then the plates are also thoroughly cleaned between changes.

After this initial lapping operation final polishing steps are conducted to remove any residual damage to the wafer surface normally resulting from the lapping operation and to produce a highly specular wafer suitable for epitaxial growth. This procedure is illustrated in FIGS. 5A to 5C and may be carried out on a separate but similar machine (or machines) than that used in the lapping steps.

Figure 5A:
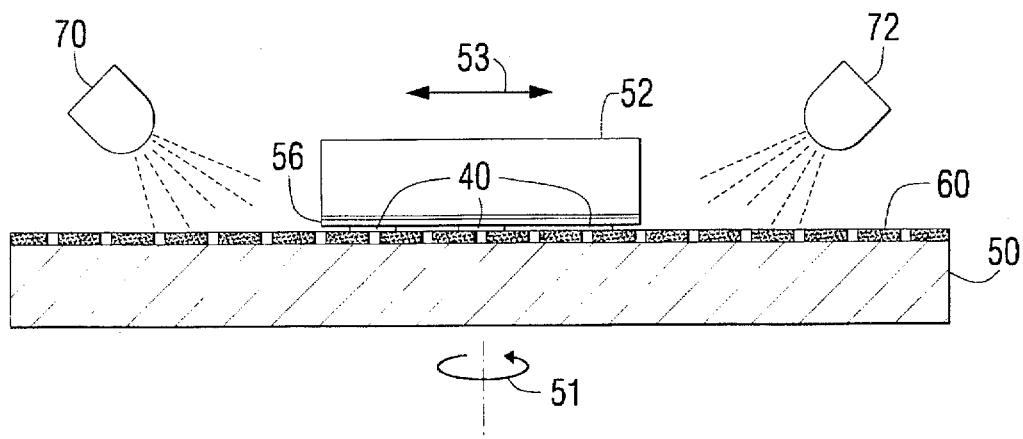
FIGS. 5A, 5B and 5C illustrate the polishing process.
Figure 5B:
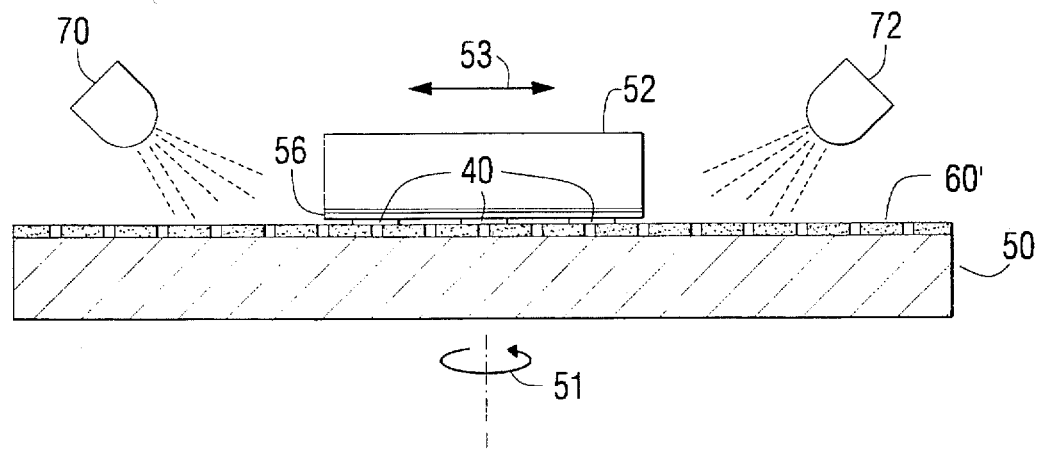
Figure 6:
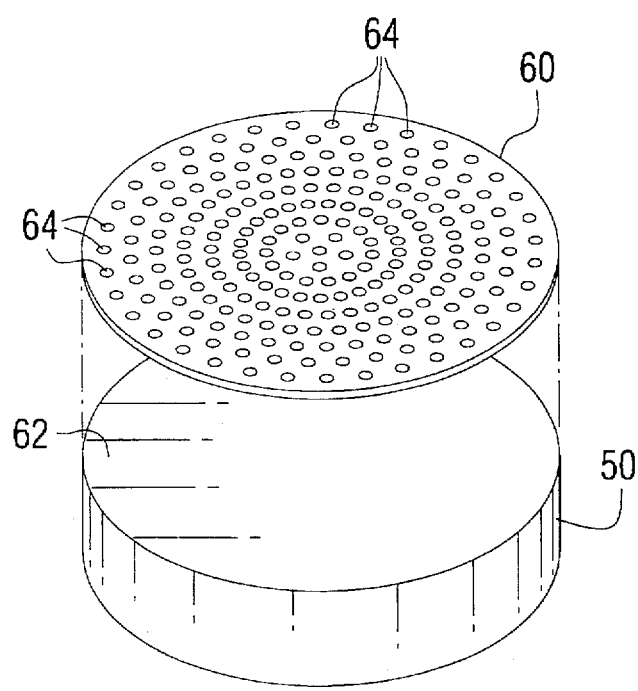
FIG. 6 is a exploded view of a perforated pad and rotating plate used in the polishing process.

In FIG. 5A, plate 50 rotates about an axis as indicated by arrow 51, and plate 52 is oscillated, as indicated by arrow 53. The underside of oscillating plate 53 includes a template 56, similar to template 30, for holding the silicon carbide wafers 40 and in the final polishing steps a pad is applied to the rotating plate 50. More particularly, and with additional reference to FIG. 6, an adhesive backed pad 60 is applied to the surface 62 of rotating plate 50. As illustrated, the pad has a plurality of perforations 64 which aid in the abrasive action during polishing. At least two, and preferably three pads are used in the instant process, with each pad being progressively softer than a preceding pad. For example, three pads of polyurethane, available from Rodel Corp. of Newark, Del., have been used in accordance with the present invention, as will be described Referring once again to FIG. 5A, with the plates moving relative to one another, a diamond slurry mixture from source 70 is periodically applied to the surface of pad 60 by a spraying action. For this initial step after lapping, the diamond slurry mixture may utilize an 8 micron grit size (C size). In addition, a lubricant such as Diasol from source 72 is also applied by spraying, although not necessarily at the same times as the diamond slurry mixture.

At least two diamond slurry mixtures are used in the polishing step, with the slurries having progressively smaller diamond grit sizes. For example, after initial polishing as in FIG. 5A, the wafers are thoroughly cleaned and put into a fresh template. A diamond slurry mixture using a diamond grit size of 4 microns (D size) is next utilized and is provided by the source 70 in FIG. 5B. A new and softer pad 60' is also provided and the diamond slurry mixture and the lubricant from source 72 are applied according to their respective schedules.

Figure 5C:
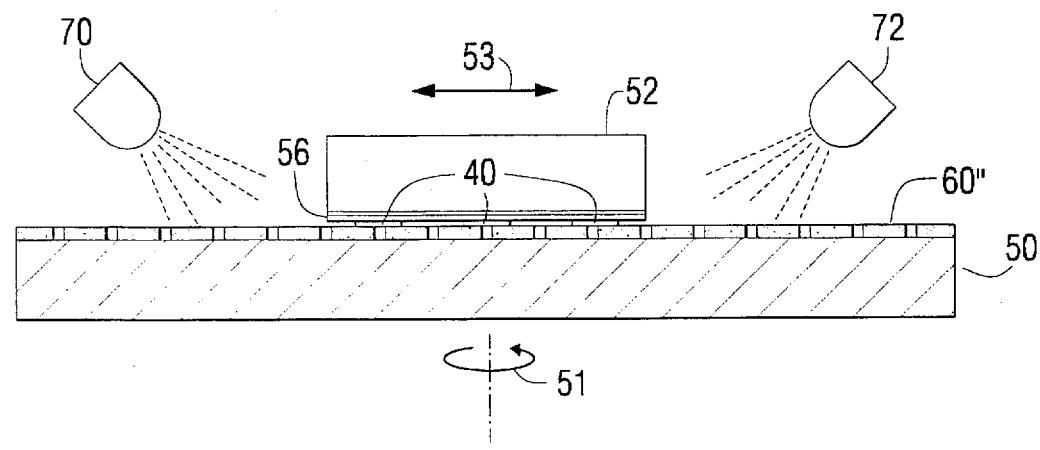

In FIG. 5C, a third pad 60" has replaced pad 60' for a final polishing, using the same grit size diamond slurry mixture as used with pad 60'. Although satisfactory results are obtainable using slurry mixtures with only two different diamond grit sizes, a third, and smaller grit size slurry mixture may be introduced with the third pad if desired.

By way of example, 6H-silicon carbide wafers each having a 1½ inch (3.81 cm) diameter were prepared in accordance with the present invention as follows.

Four of the 6H-silicon carbide wafers were placed in a template 30, as in FIG. 2, backed by a brass plate 20. For the initial lapping procedure the rotational speed of the rotating plate 12, which was cast iron, (FIG. 1) was 60 revolutions per minute and the oscillation speed of the brass upper plate 20 was 20 cycles per minute. The respective diamond slurry mixtures used for the following procedures were formulated by initially mixing the respective diamond slurries, as obtained from the Fujimi Corporation, with the Diasol lubricant in a proportion of one part slurry to two parts lubricant.

After an initial application of both diamond slurry mixture of grit size A and lubricant, the lubricant was applied every 3 minutes for 5 seconds and the diamond slurry mixture was applied every 5 minutes for 5 seconds. This initial lapping step continued for approximately 1½ hours.

After this initial step, the wafers were removed and thoroughly cleaned with deionized water and placed in a new template. In addition, a new plate was utilized for a second lapping step with a diamond slurry mixture of grit size B. This second lapping step continued for approximately 40 minutes during which time the lubricant was applied for 5 seconds every 3 minutes and the diamond slurry mixture was applied for 5 seconds every 5 minutes. The pressure applied to the wafer set during both steps of the lapping process was 10 psi (68.95 kPa).

For the subsequent polishing operation, the wafers were cleaned and placed into a new brass-backed template 52 (FIG. 5A) oscillated at a speed of 20 cycles per minute and an aluminum rotating plate 50 was used, with a rotational speed of 60 revolutions per minute. The first pad 60 applied to the surface of plate 50 was a Rodel Corporation microporus blown polyurethane pad designated as their IC60. A diamond slurry mixture of grit size C was initially used along with lubricant with application times being for 10 seconds every 2½ minutes, for the lubricant, and for 10 seconds every 5 minutes for the slurry mixture. Total time for this first step was 2 hours.

After the first step, and after cleaning of the wafers, a new pad, 60', was applied for use with a diamond slurry mixture of grit size D and a new template was employed. Pad 60' was a Rodel model designated as Suba 500. Lubricant application was for 10 seconds every 2 minutes and diamond slurry mixture application was for 10 seconds every 4 minutes, for a total of 2 hours.

The wafers were again cleaned for a final polishing still using grit size D, however with a new pad, 60", Rodel model designated as Politex Supreme. Lubricant and diamond slurry mixture application times were the same as in the second polishing step, and also for a 2 hour time period. For all of the polishing steps, the apparatus maintained a pressure of 5 psi (34.47 kPa) on the wafers.

A wafer prepared in accordance with the above process was subjected to a UV haze system for assessment of surface damage. Such UV haze systems are well know and used for surface inspection. In such system the wafer is rotated, and chopped UV light illuminates the wafer surface to an extinction depth of 0.1 micron. The scattered light, after passing through a filter, is detected by a photomultiplier and provided to an amplifier. There is little scattering of light from a polished surface with no defects, whereas a surface with scratches cause more scattering. By rotating the wafer while keeping the UV light source fixed, the defects can be detected through the UV haze signature, which is the intensity variations of the backscattered light as a function of rotation angle.

Figure 8:
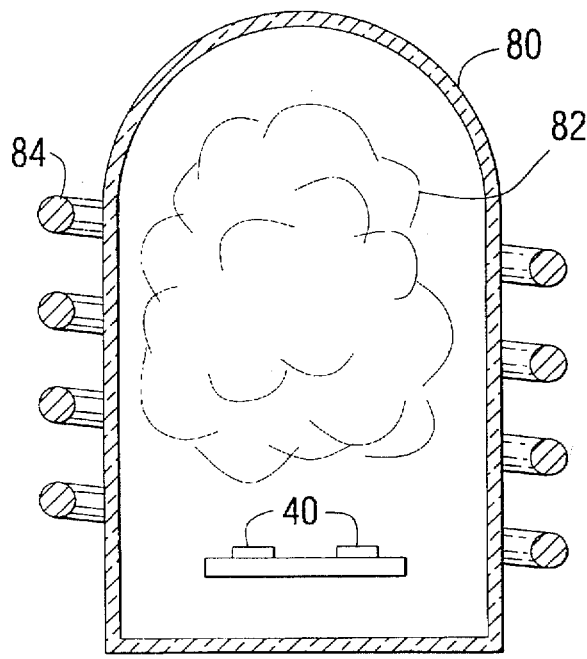
FIG. 8 illustrates a final plasma etch step in the preparation of the silicon carbide wafer.
Figure 7A:
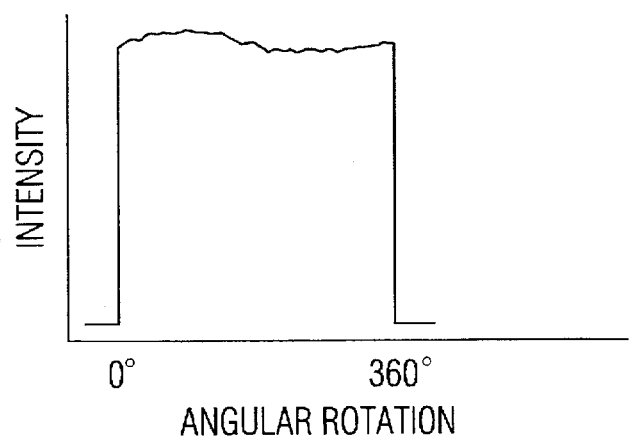
FIGS. 7A, 7B and 7C illustrate various UV haze measurement results.
Figure 7B:
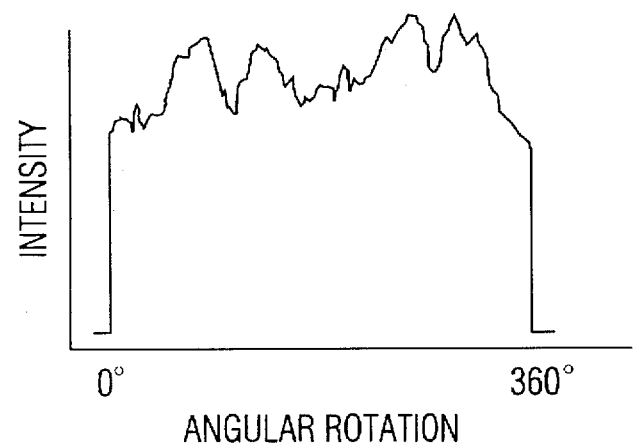
Figure 7C:
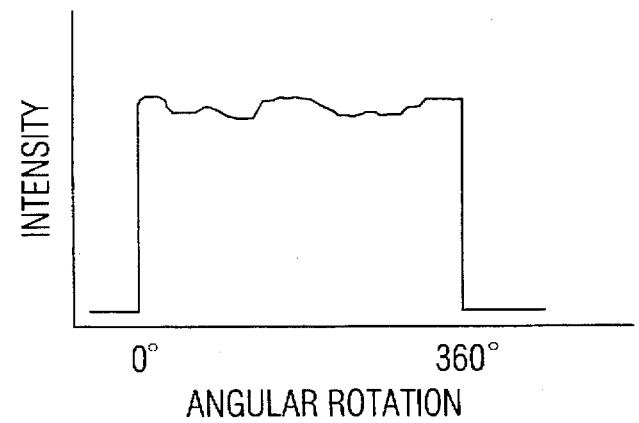

FIG. 7A illustrates the UV haze signature of a standard, the standard being a polished wafer of silicon which is easily polished and has very little intensity variations throughout its rotation. FIG. 7B illustrates the UV haze signature of an optically polished wafer of silicon carbide polished utilizing a waxdown process. Total preparation time for this wafer was approximately seven working days. In contrast thereto FIG. 7C shows the UV haze signature of a silicon carbide wafer produced in accordance with the teachings of the present invention and as set out by the above detailed steps. The intensity variations are substantially reduced over that illustrated in FIG. 7B and almost approaches that of the standard illustrated in FIG. 7A. In comparison to the waxdown process, the total preparation time for this wafer was approximately one working day. The wafer is totally acceptable for many applications, however a substantially defect-free surface may be produced by subjecting the wafer to further processing, and to that end reference is made to FIG. 8.

A final finishing operation may be carried out on the wafer surface by a reactive ion etch wherein the wafers 40 are placed in a vacuum chamber 80 containing ionizable gas or gases 82. Under action of radio frequency source 84 a plasma is created within the chamber 80 and etches the wafer surface until substantially all surface defects are etched away.

What is claimed is:

1. A method of preparing a surface of each of a plurality of silicon carbide wafers, comprising the steps of:

initially placing said wafers in respective recesses of a multiple recess wafer holding template, with said surface of each said wafer extending beyond the surface of said template;

placing said surfaces of said wafers against a rotating plate of sufficient hardness to lap silicon carbide and moving said template relative to said rotating plate;

lapping said wafer surfaces by successively applying a plurality of diamond slurry mixtures and a lubricant to the surface of said rotating plate during movement of said template relative to said rotating plate, with a second and any subsequent said diamond slurry mixture having a smaller grit size than a preceding said diamond slurry mixture;

polishing said lapped wafer surfaces by successively applying pads to a surface of a rotatable plate and relatively moving said wafer surfaces against said pads, with a second and any subsequent said pad being of a softer composition than a preceding said pad; and during said polishing, successively applying a plurality of diamond slurry mixtures and a lubricant to the surfaces of said pads during movement of said pads relative to said wafer surfaces, with a second and any subsequent said diamond slurry mixture having a smaller grit size than a preceding said diamond slurry mixture.

2. A method according to claim 1 which includes the step of:

initially placing and adhesively securing said template against a backing plate.

3. A method according to claim 1 which includes the step of:

changing said template with each new diamond slurry mixture used in said lapping and said polishing process steps.

4. A method according to claim 1 which includes, for the polishing operation, the step of:

utilizing pads with apertures therein.

5. A method according to claim 1 which includes, for the polishing operation, the steps of:

utilizing two different diamond slurry mixtures; and utilizing three different pads.

6. A method according to claim 1 which includes, for the lapping operation, the steps of:

utilizing two diamond slurry mixtures having respective diamond grit sizes of 15 microns and 12 microns.

7. A method according to claim 1 which includes, for the polishing operation, the steps of:

utilizing two diamond slurry mixtures having respective diamond grit sizes of 8 microns and 4 microns.

8. A method according to claim 1 which includes the step of:

subjecting the polished silicon carbide wafer surface to a reactive ion etch.

* * * * *